US 6,609,238 B1

(12) United States Patent
Tetelbaum

(10) Patent No.: US 6,609,238 B1
(45) Date of Patent: Aug. 19, 2003

(54) METHOD OF CONTROL CELL PLACEMENT TO MINIMIZE CONNECTION LENGTH AND CELL DELAY

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 22 days.

(21) Appl. No.: 09/882,114

(22) Filed: Jun. 15, 2001

(51) Int. Cl.[7] .............................................. G06F 17/50
(52) U.S. Cl. .................. 716/10; 716/3; 716/5
(58) Field of Search .............. 716/1–5, 6, 7, 716/9–14

(56) References Cited

U.S. PATENT DOCUMENTS

| | | | | |
|---|---|---|---|---|
| 4,922,432 A | * | 5/1990 | Kobayashi et al. | 364/490 |
| 5,185,706 A | * | 2/1993 | Agrawal et al. | 364/489 |
| 5,499,192 A | * | 3/1996 | Knapp et al. | 364/489 |
| 5,956,643 A | * | 9/1999 | Benveniste | 455/452 |
| 6,463,571 B1 | * | 10/2002 | Morgan | 716/5 |

OTHER PUBLICATIONS

Smith; "Application–Specific Integrated Circuits"; Addison-Wesley, Boston, 1997; p. 17.

* cited by examiner

Primary Examiner—Wilson Lee
(74) Attorney, Agent, or Firm—Fitch, Even, Tabin & Flannery

(57) ABSTRACT

A method of control cell placement for an integrated circuit design includes the steps of receiving as input a description of a datapath structure for a hardmac; calculating a globally optimum placement with respect to connection length and delay for a group of control cells in the plurality of control cells; placing the plurality of control cells in at least one placement box; adding the placement of the plurality of control cells to an existing placement of a plurality of datapath cells in the description of the datapath structure to generate a globally optimum datapath structure for the plurality of control cells; and generating as output the globally optimum datapath structure.

19 Claims, 19 Drawing Sheets

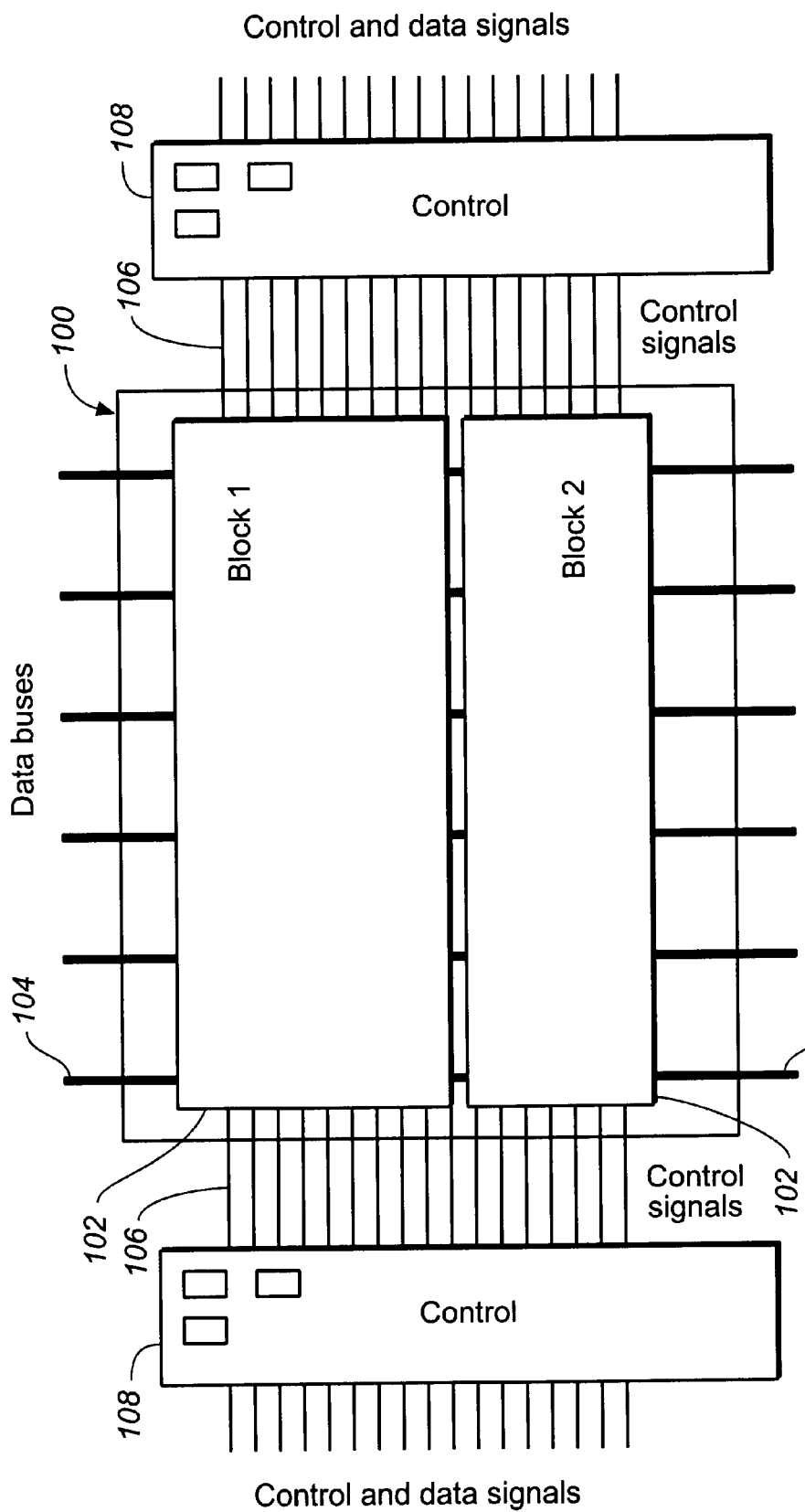
FIG._1
*(PRIOR ART)*

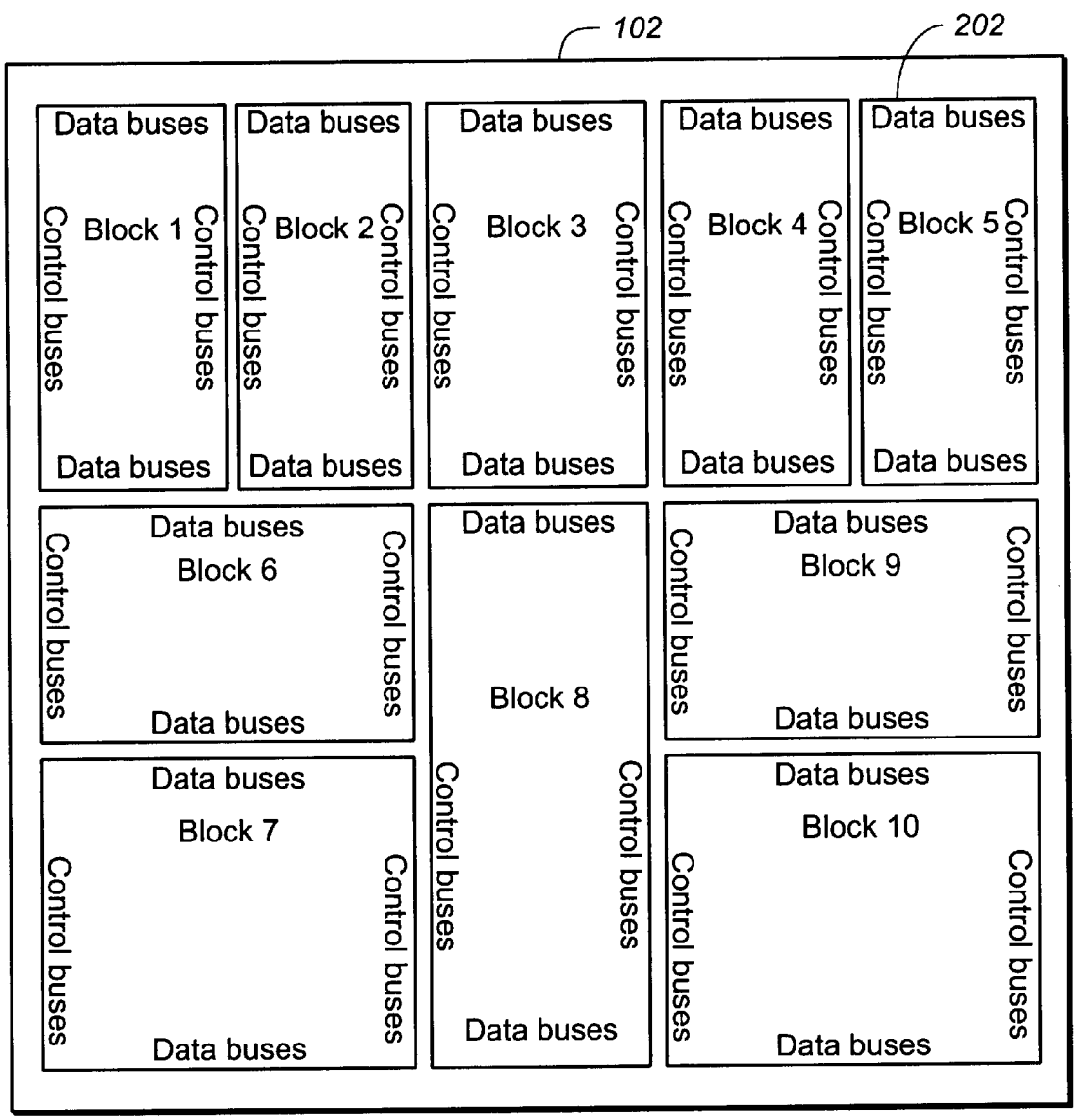
FIG._2

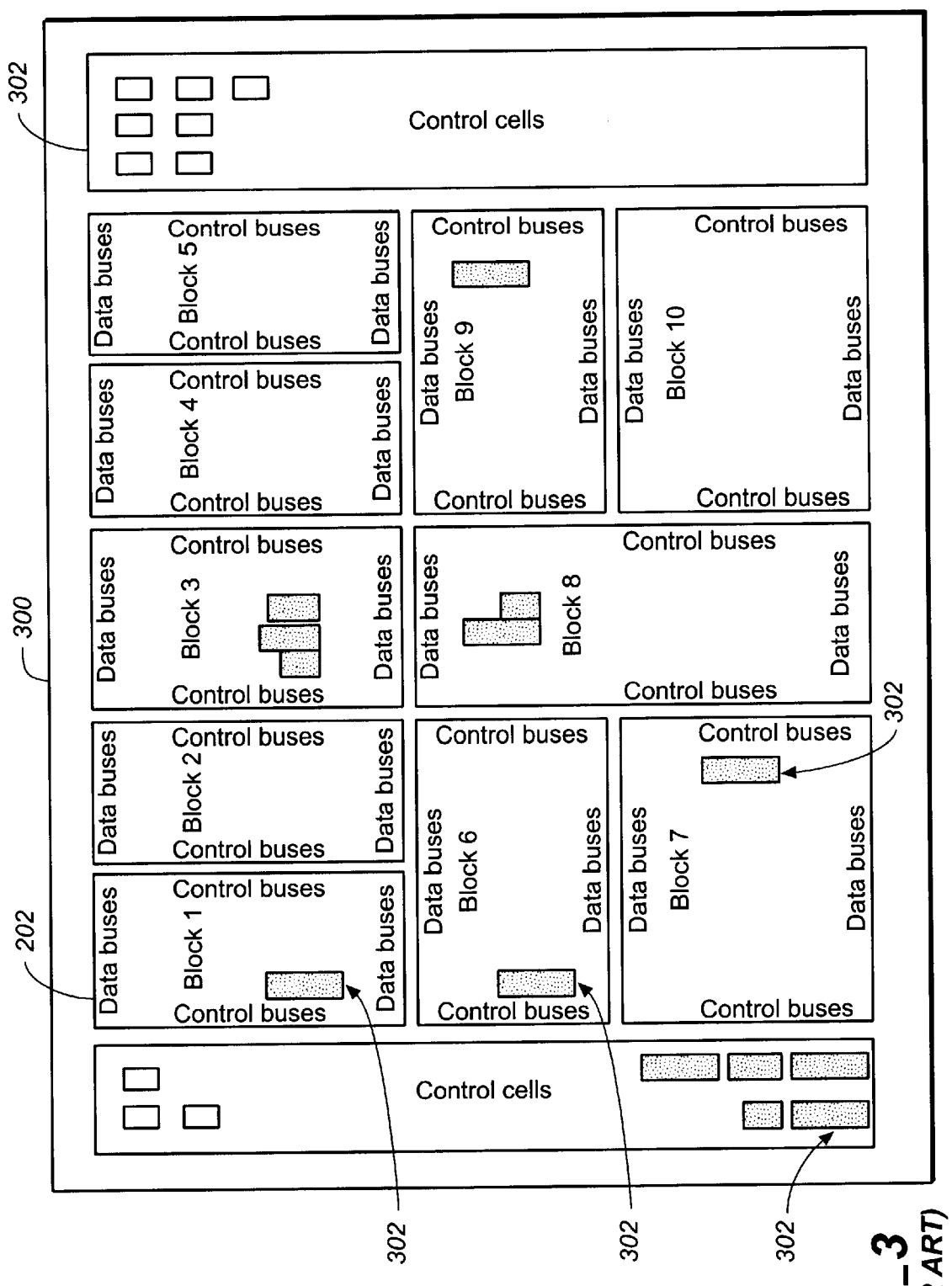
FIG._3
(PRIOR ART)

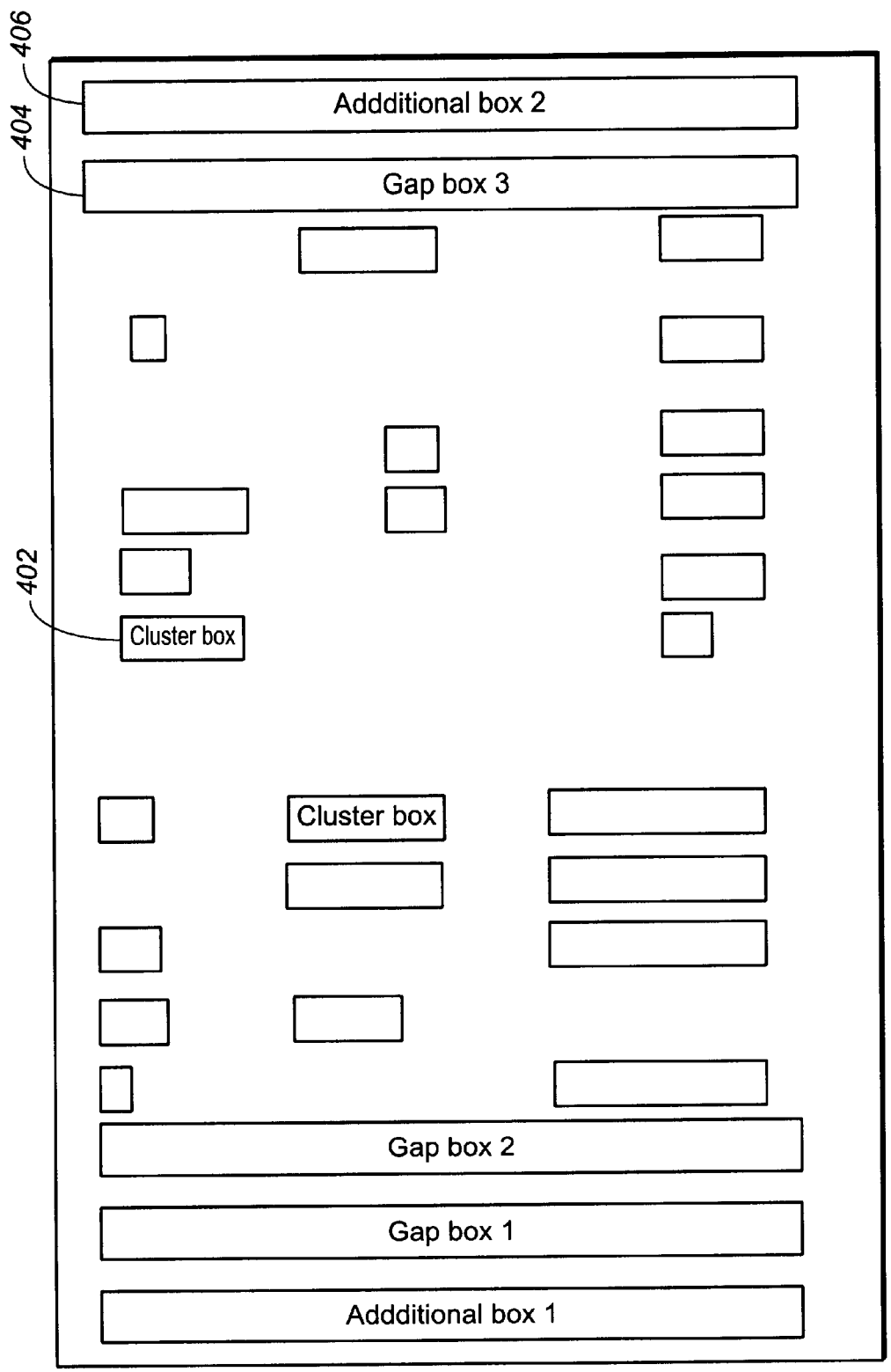
FIG._4
(PRIOR ART)

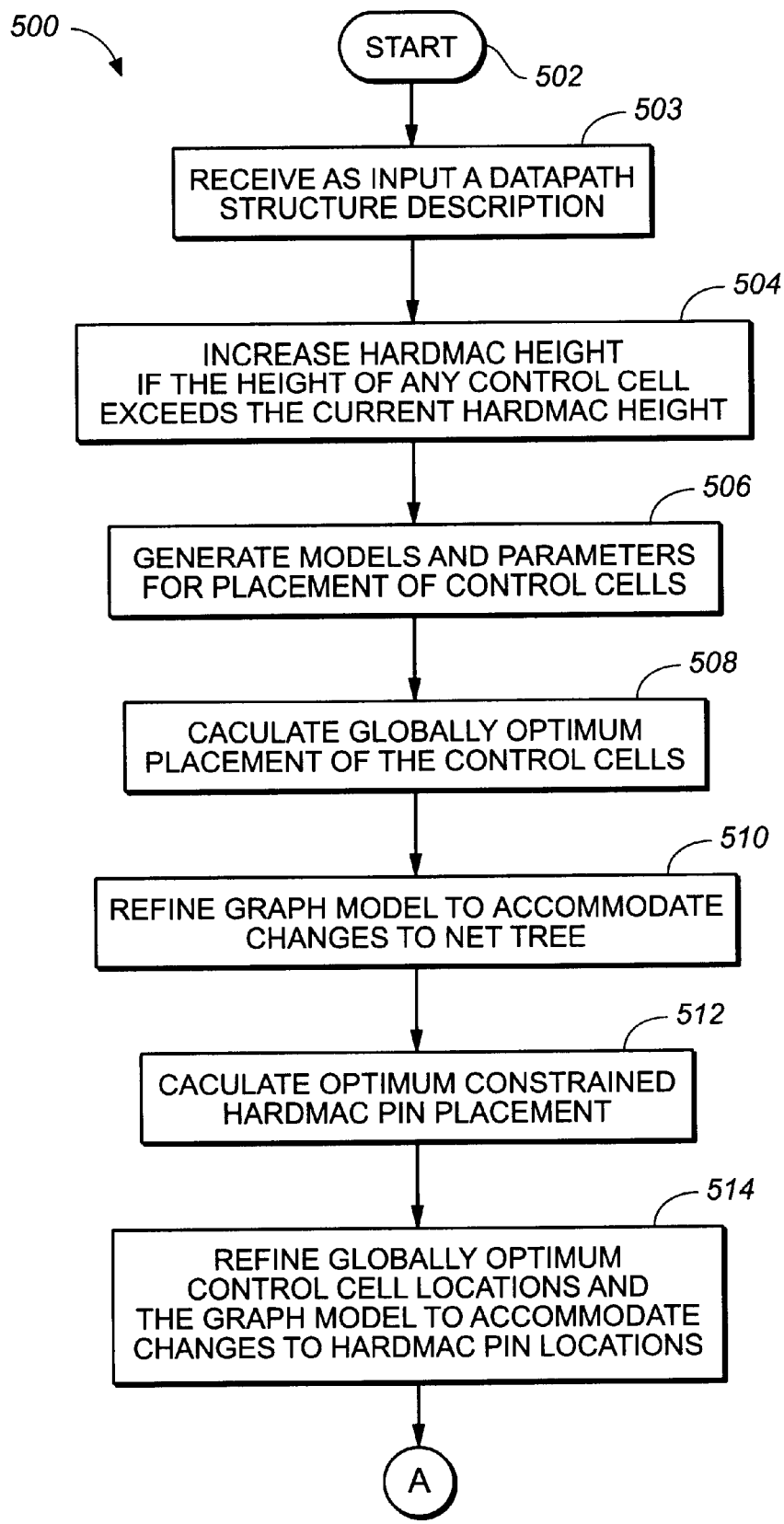
FIG._5A

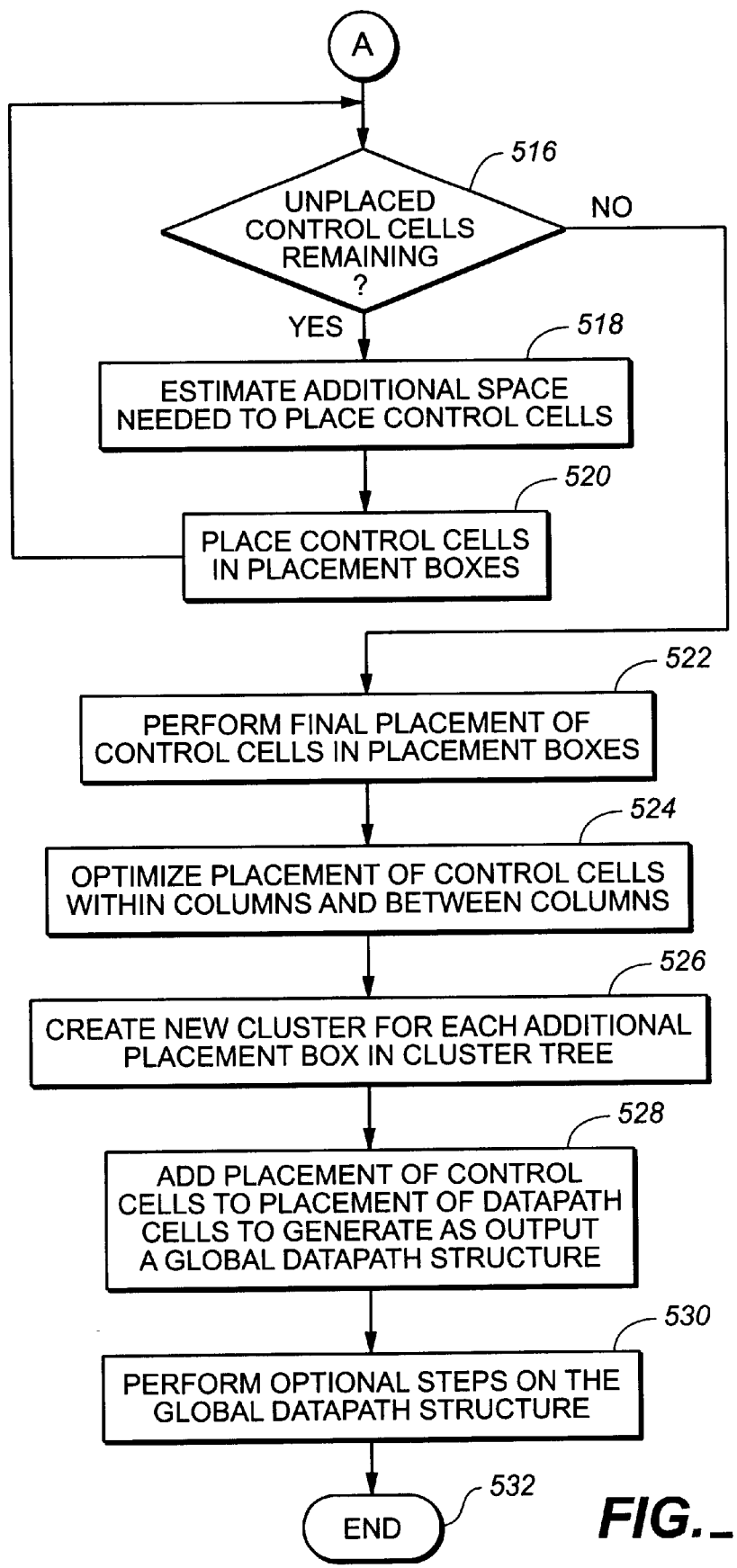
FIG._5B

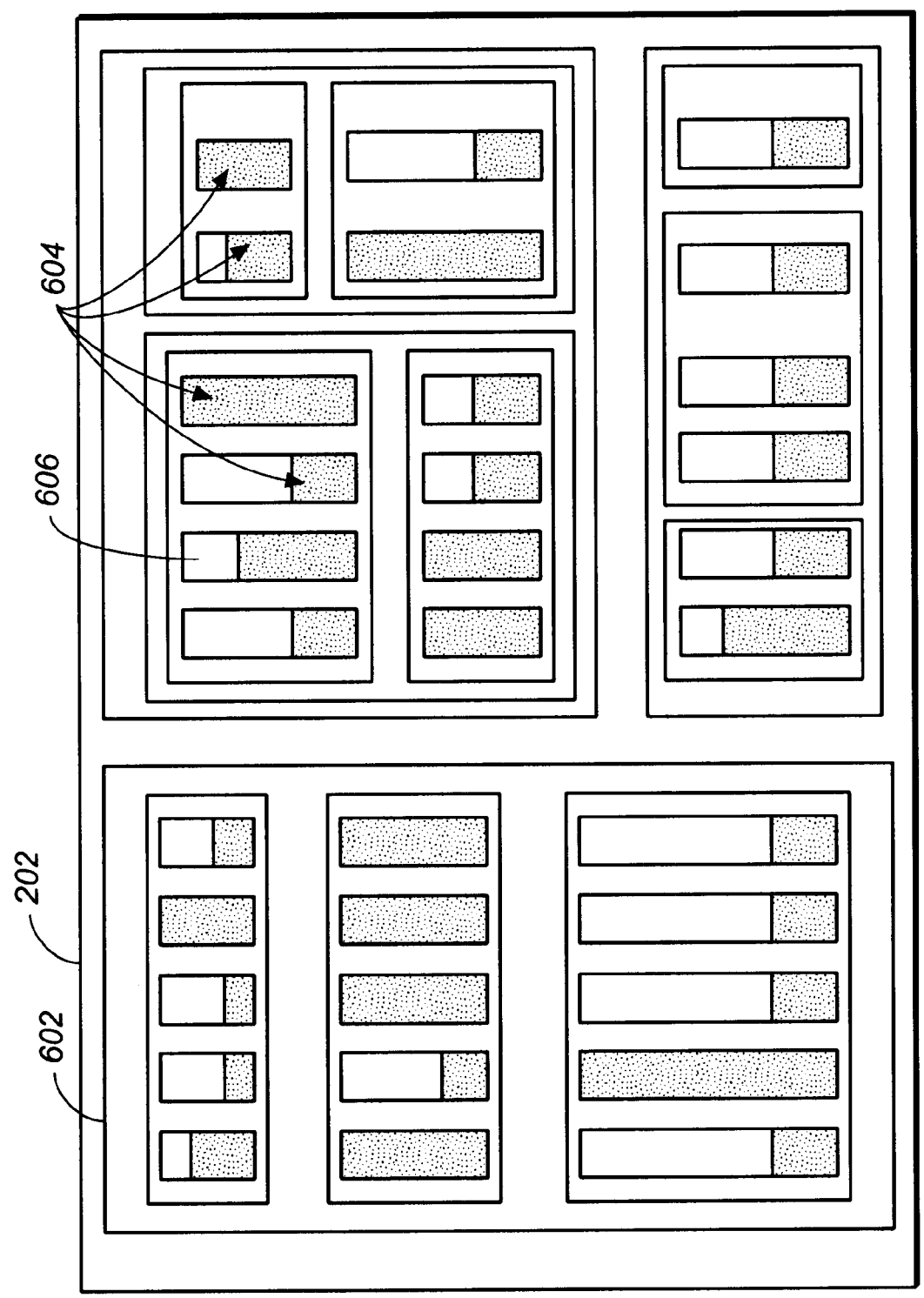
FIG._6

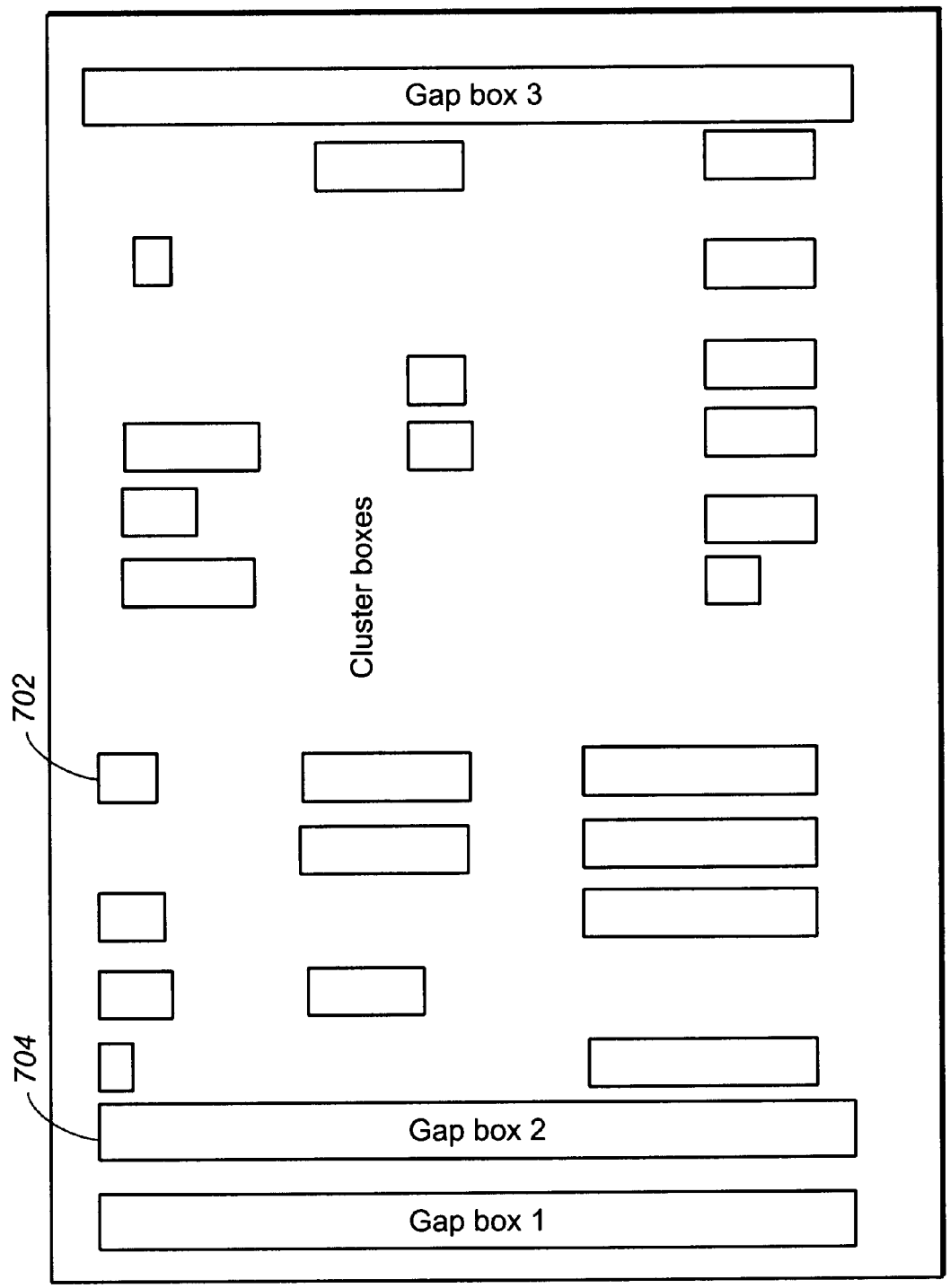
FIG._7

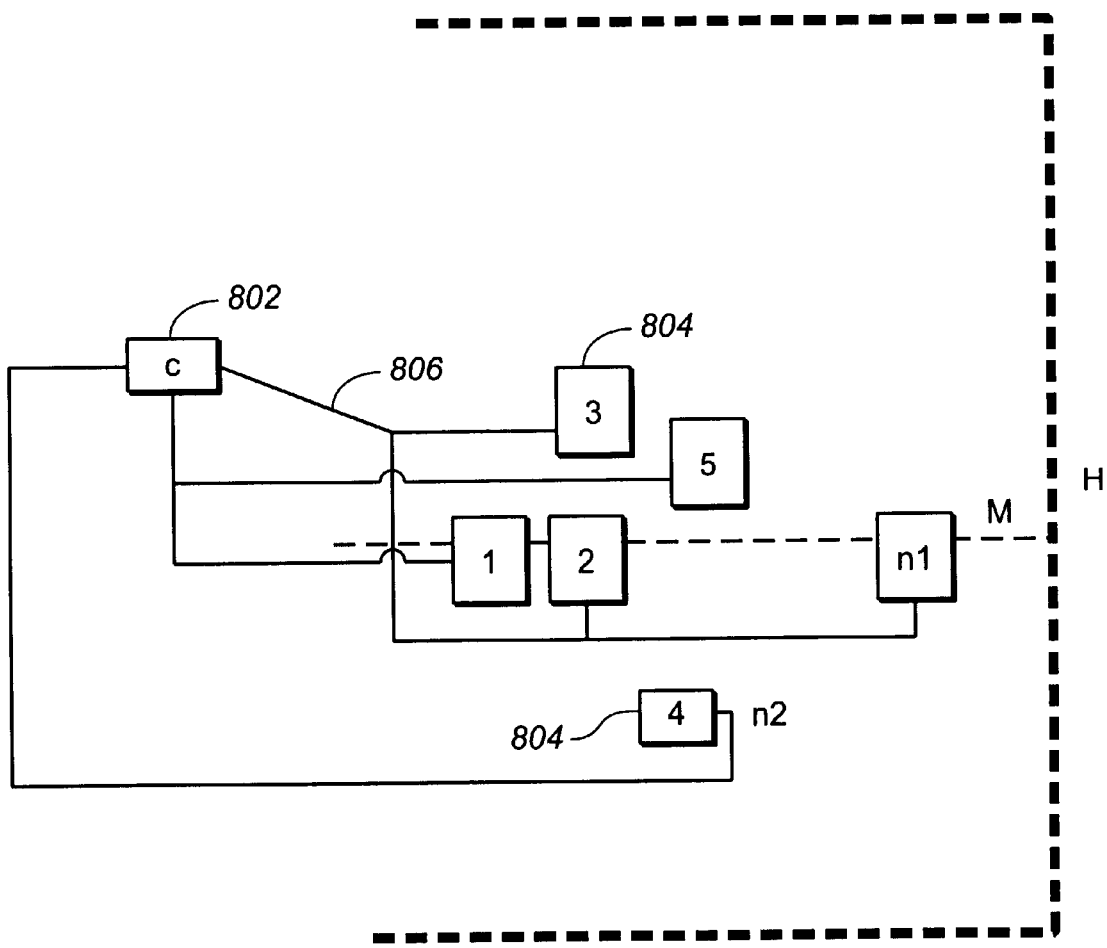
FIG._8
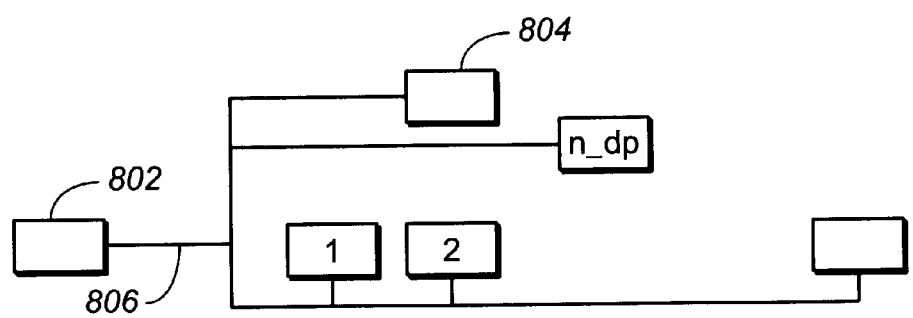
FIG._9

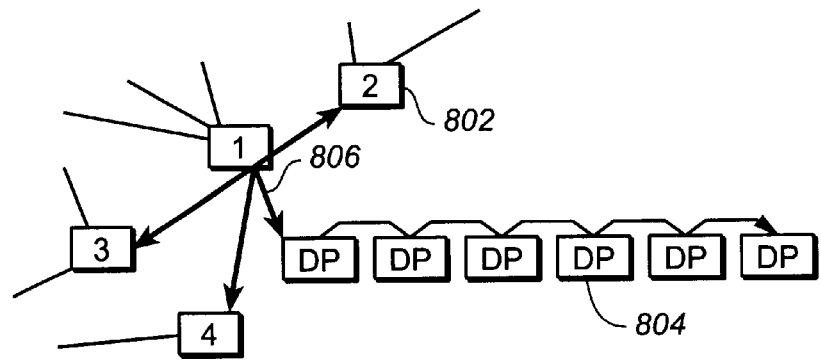
FIG._10A
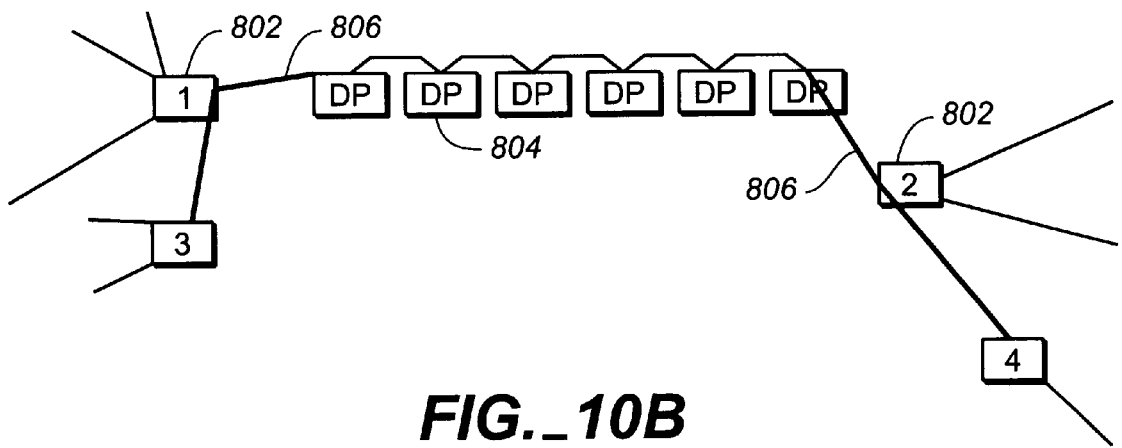
FIG._10B

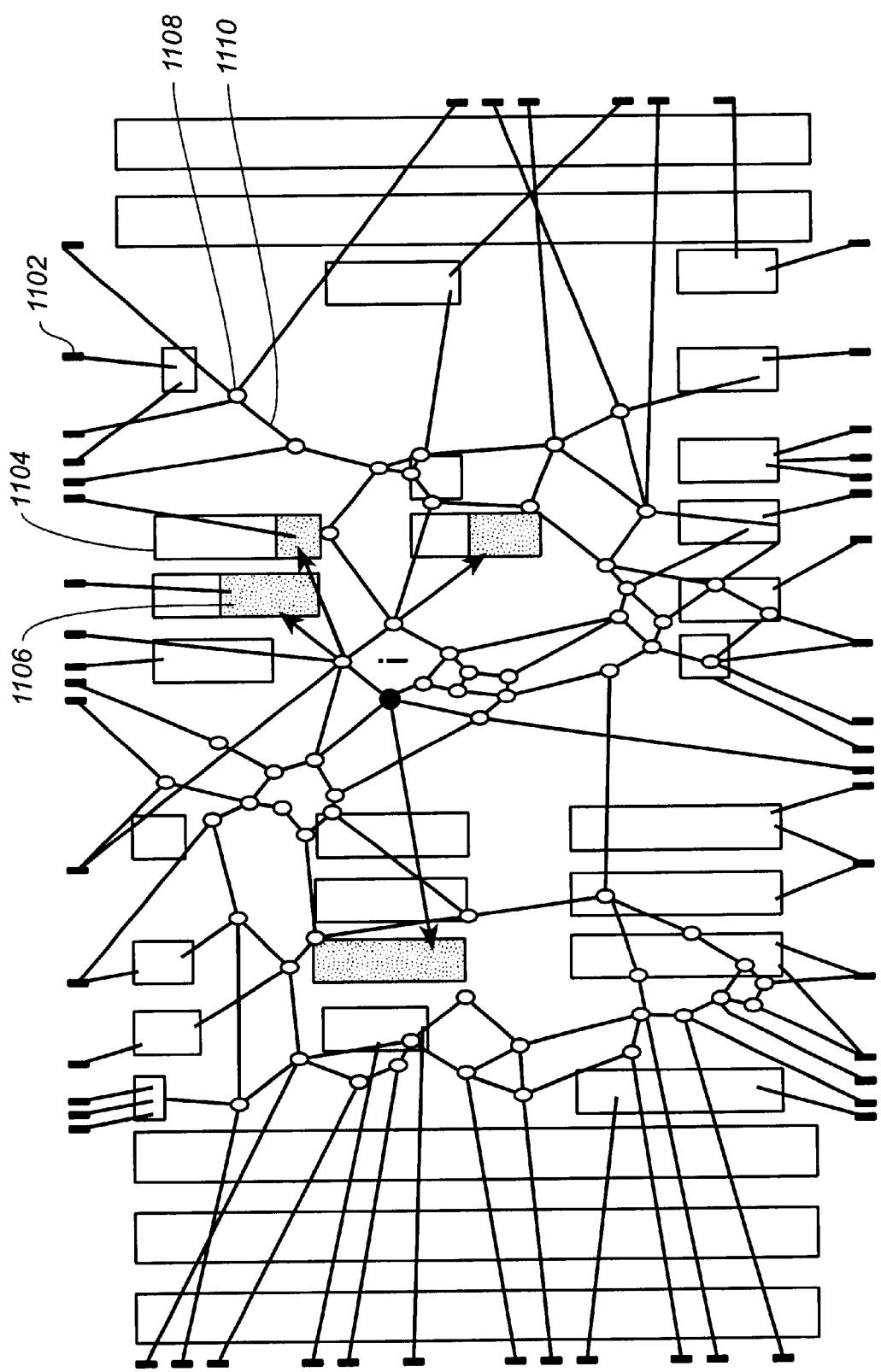
FIG._11

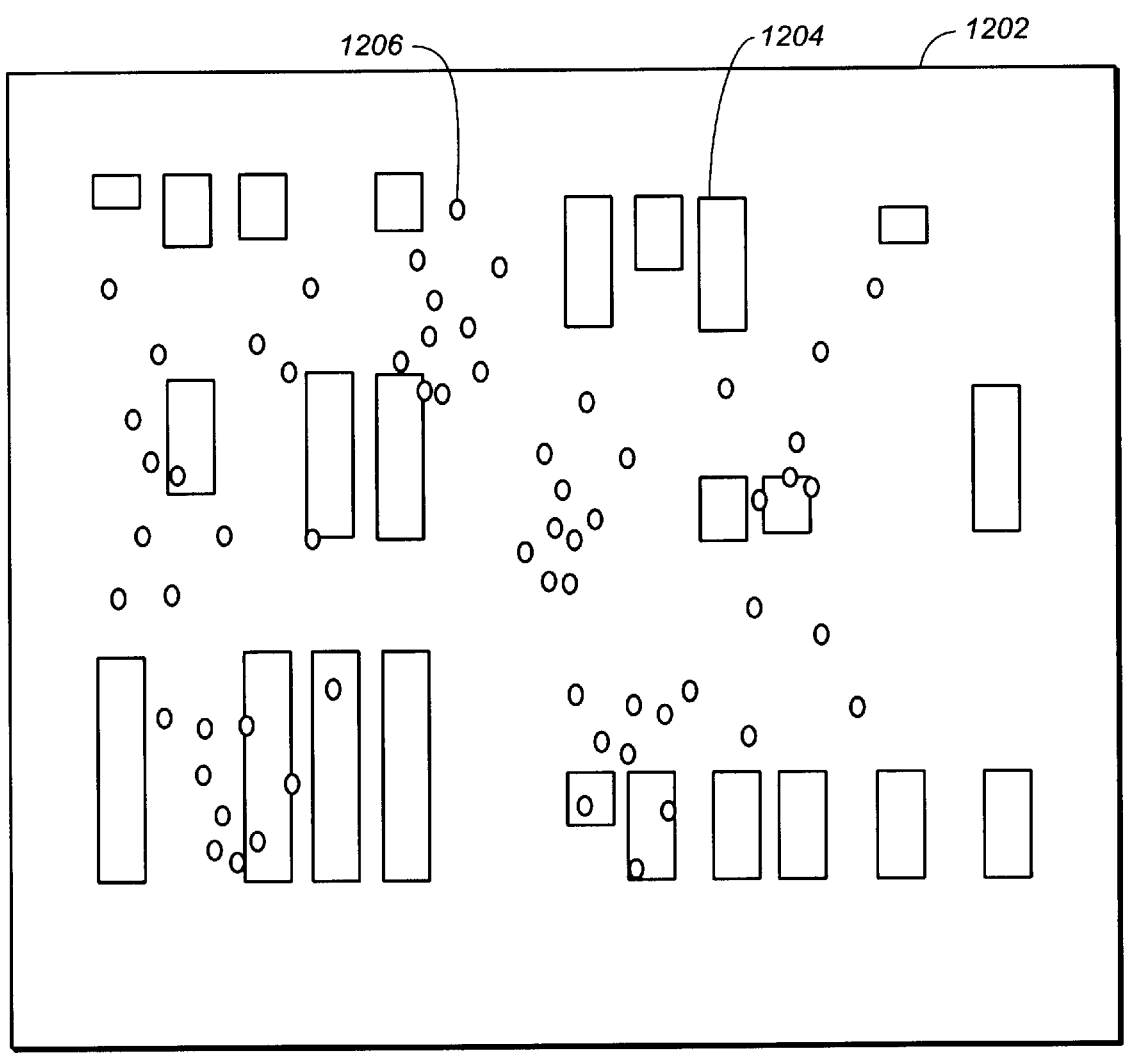
FIG._12

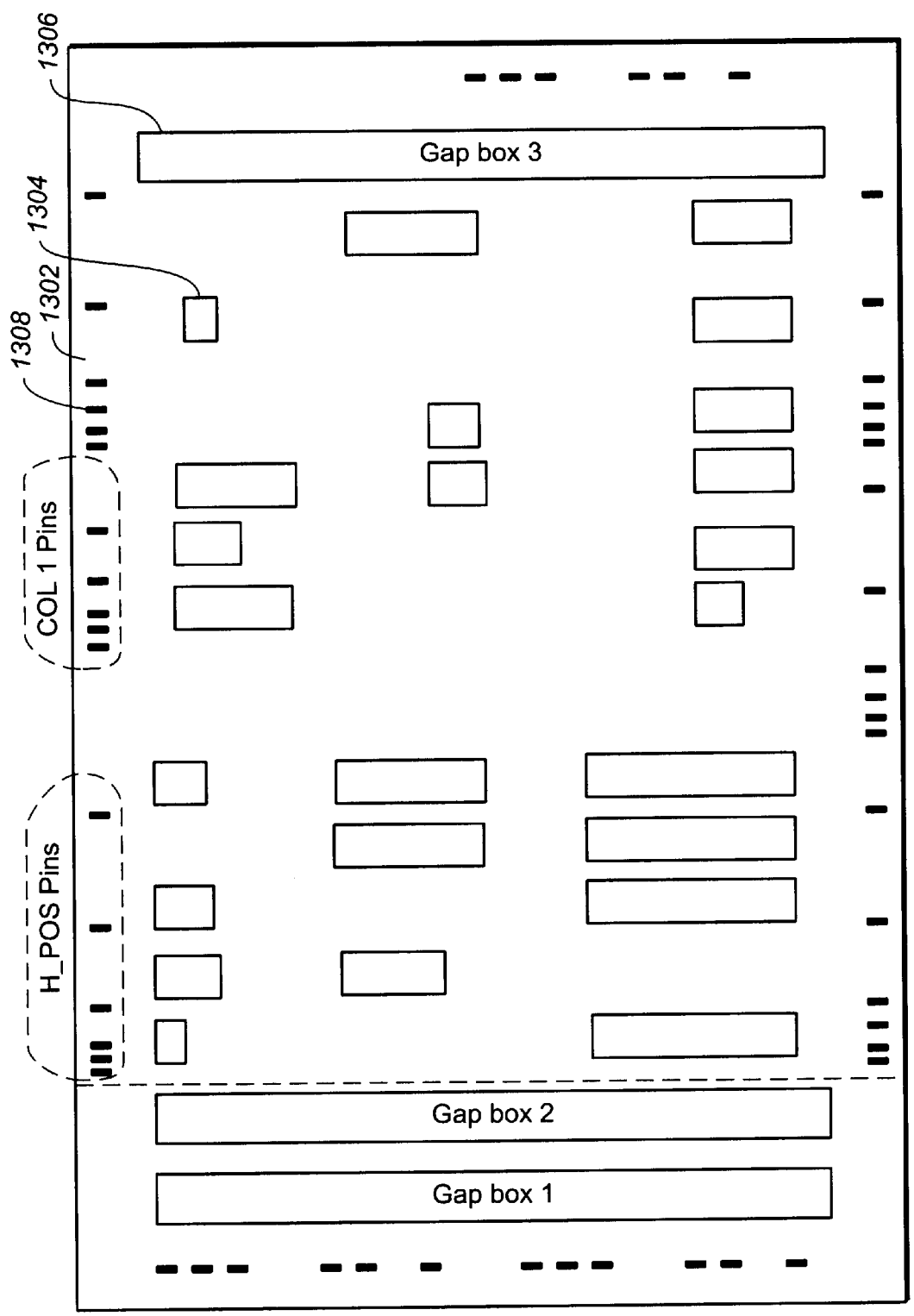
FIG._13

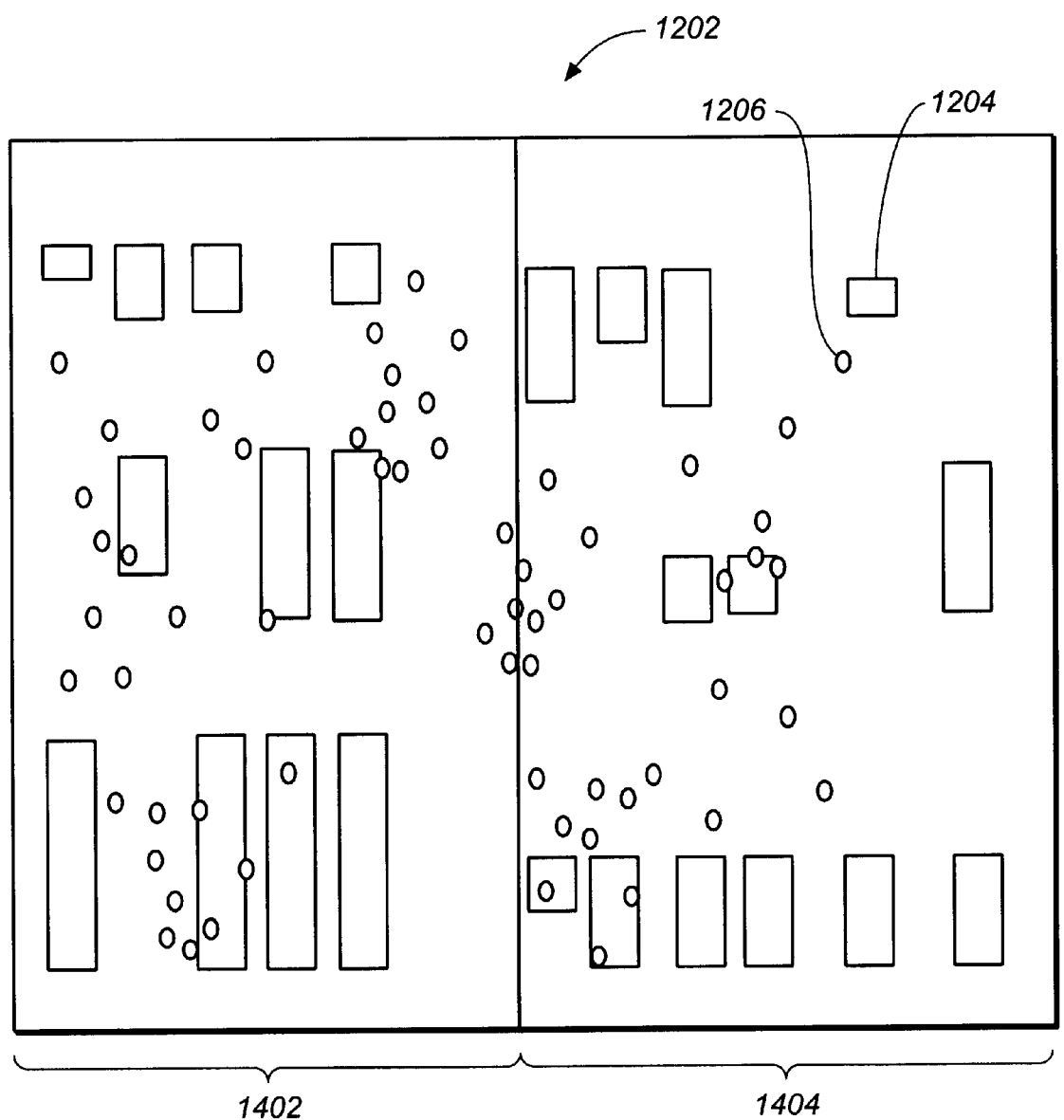
FIG._14A

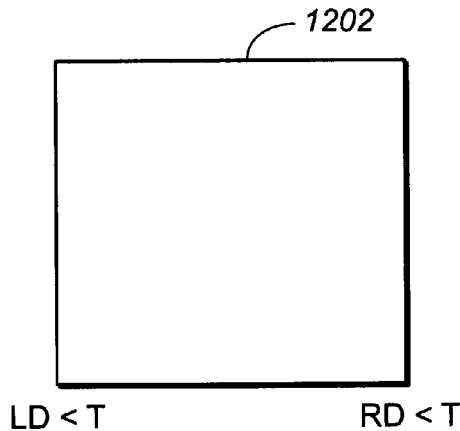
LD < T    RD < T
FIG._14B
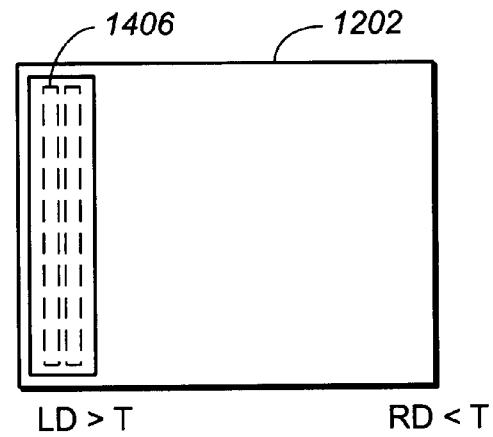
LD > T    RD < T
FIG._14C
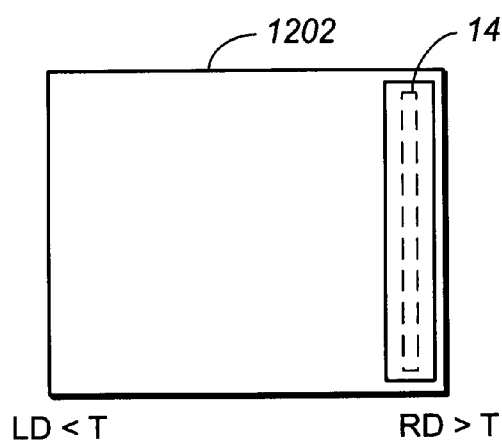
LD < T    RD > T
FIG._14D
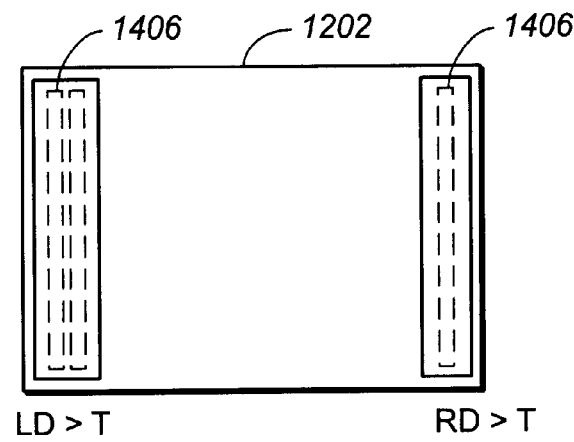
LD > T    RD > T
FIG._14E

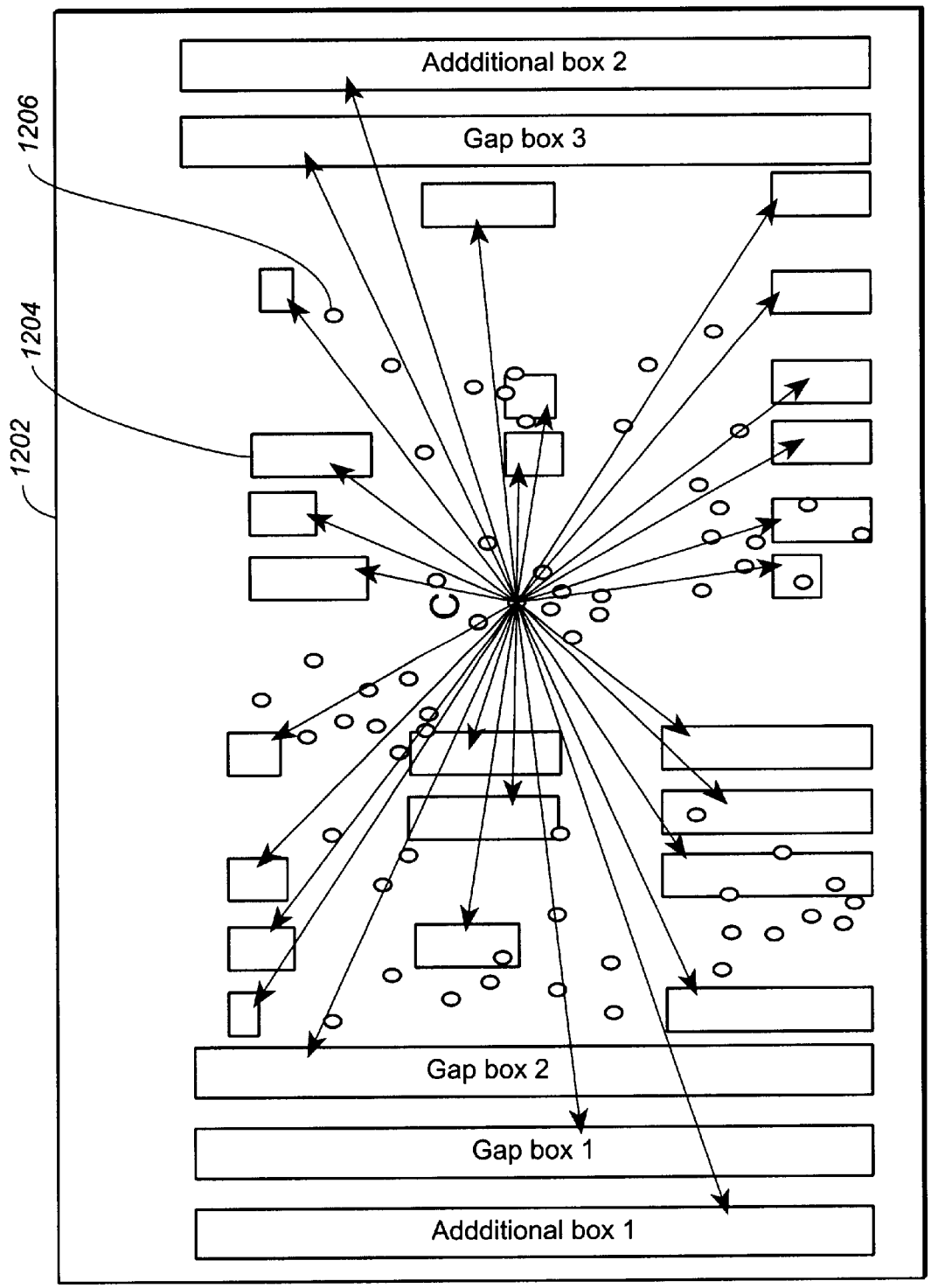
FIG._15

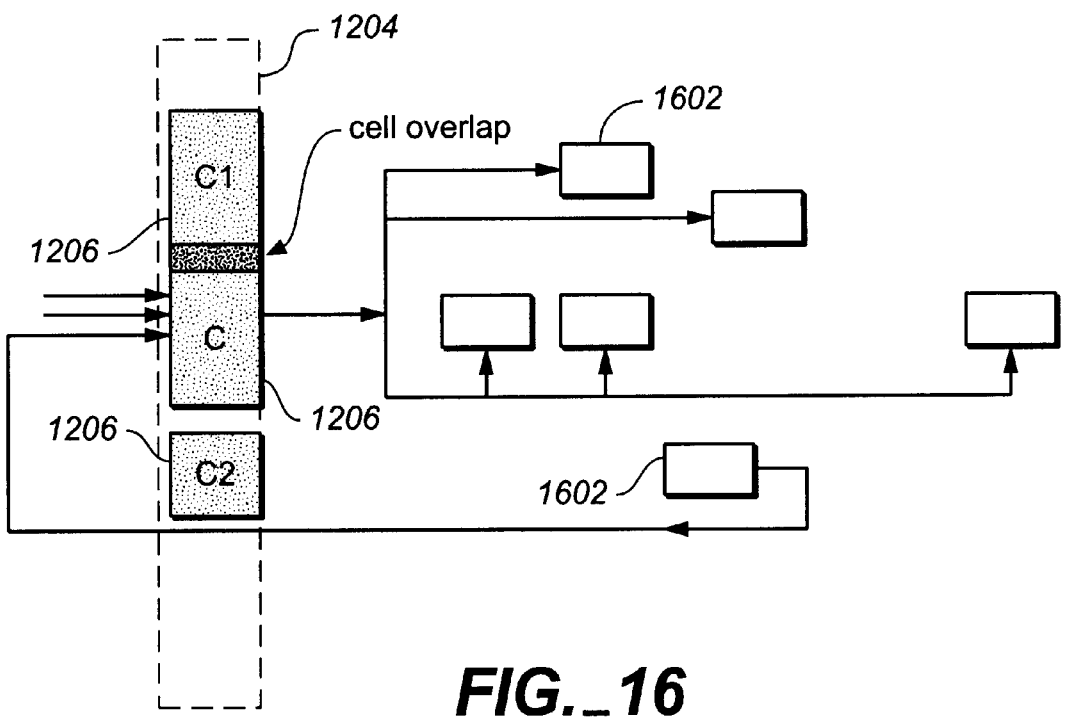
FIG._16
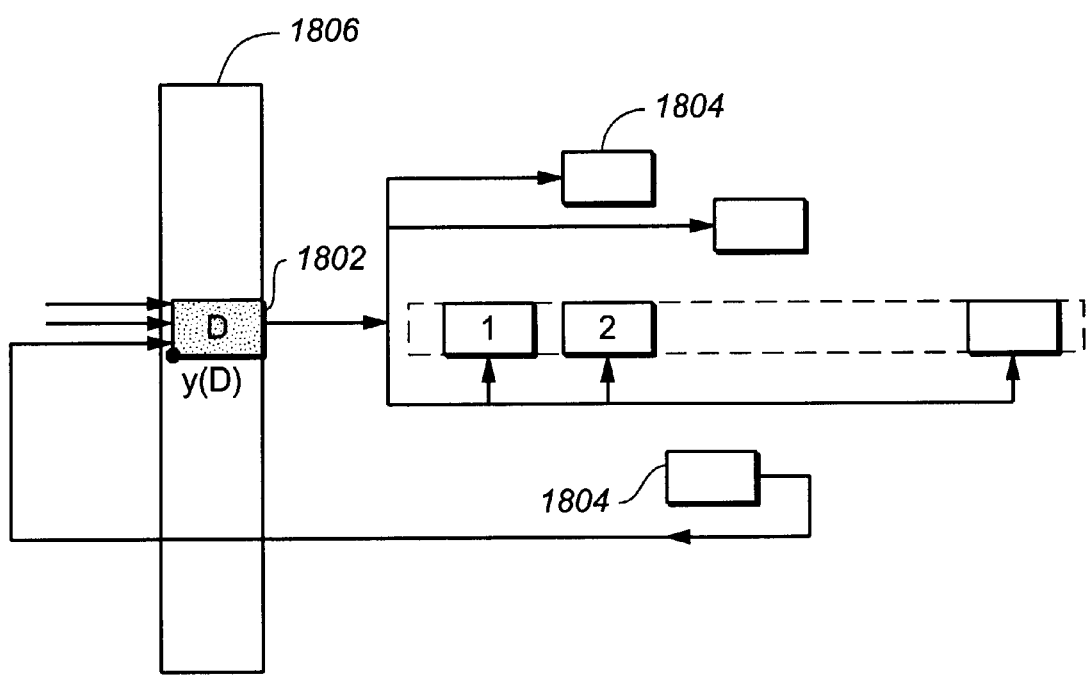
FIG._18

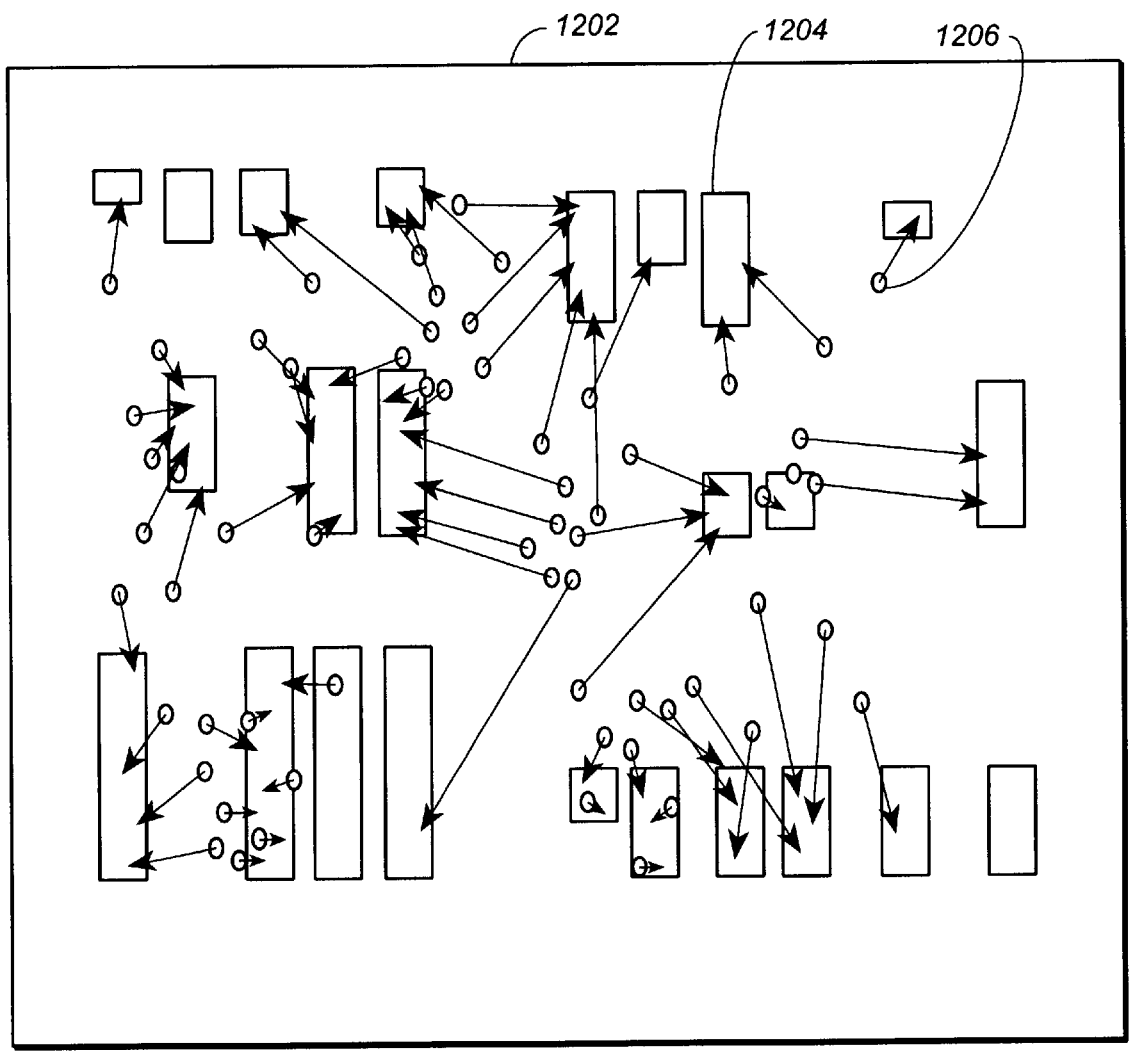
FIG._17A

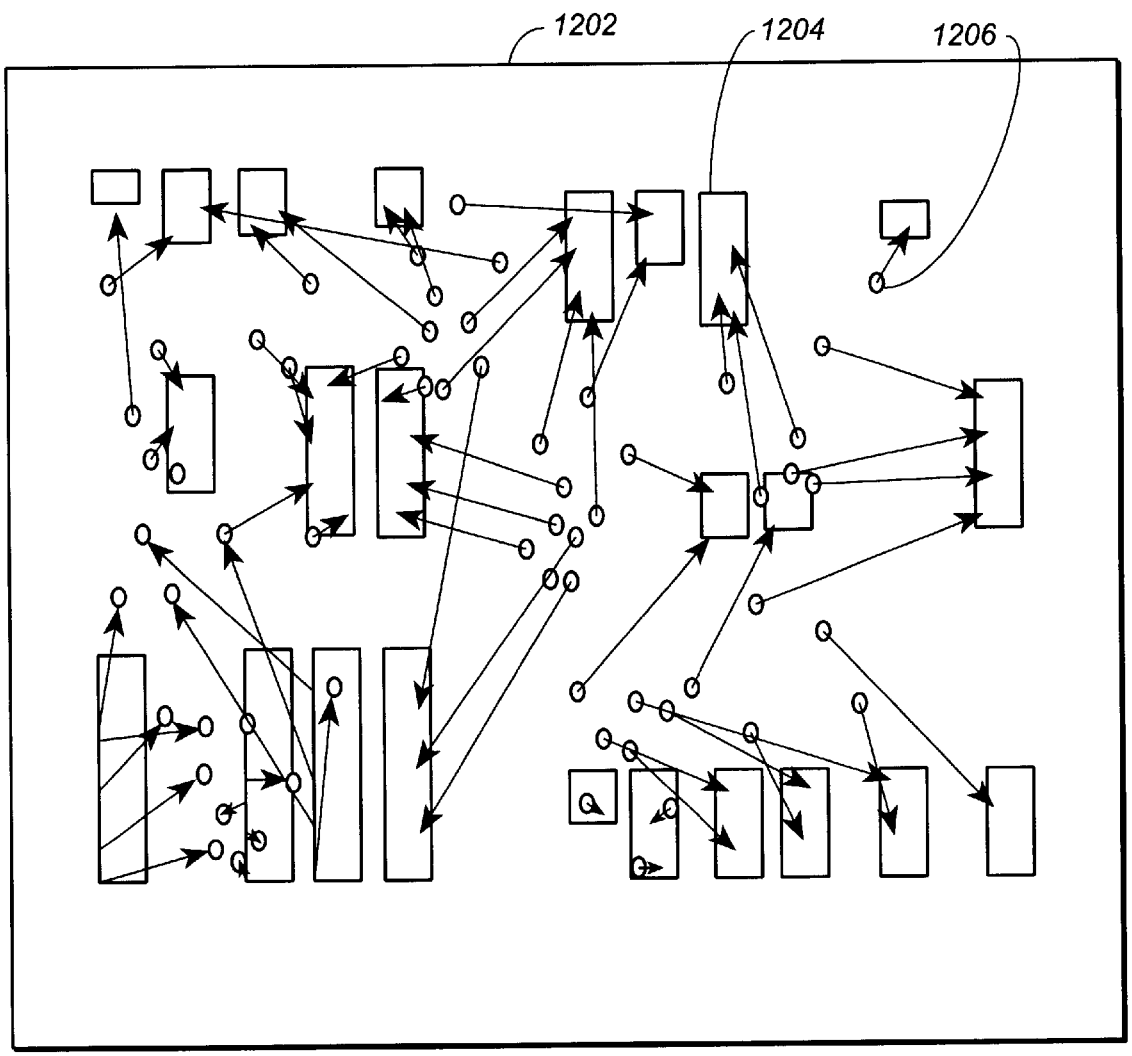
FIG._17B

METHOD OF CONTROL CELL PLACEMENT TO MINIMIZE CONNECTION LENGTH AND CELL DELAY

BACKGROUND OF THE INVENTION

The present invention relates generally to design tools for integrated circuits. More specifically, but without limitation thereto, the present invention relates to a method of placing control cells within a datapath macro to minimize signal propagation time and datapath macro area.

Integrated circuits typically include datapath macros. A datapath macro is an arrangement of datapath blocks connected by data buses and control signals. The data buses are generally routed vertically, and the control signals are generally routed horizontally. The datapath macro contains a set of datapath blocks placed along the vertical direction. Each datapath block has a datapath structure in which most data buses and control buses are located orthogonally with respect to each other and are connected to datapath cells in the datapath structure. Each of the datapath cells is connected to one or more of the data buses and to one or more of the control signals. As the size and complexity of the datapath macros and constituent datapath blocks increases, it becomes increasingly difficult for cell placement tools to arrange the datapath cells so that the signal propagation time through the datapath macro and the area of the datapath macro are minimized for datapath macro designs that include complex hierarchical structures, complex input constraints imposed on the placement of cells, pins, nets, gaps between cells, and so on. As the size and complexity of the datapath macros and constituent datapath blocks increases, therefore, signal propagation time through the datapath macro and the area of the datapath macro may be not be optimally minimized using conventional place and route methods.

SUMMARY OF THE INVENTION

The present invention advantageously addresses the problems above as well as other problems by providing a method of control cell placement in a datapath macro design that advantageously accommodates datapath structures having a large number of datapath and control cells, produces a globally ideal control cell placement in terms of connectivity length and interconnection delays.

In one embodiment, the present invention may be characterized as a method of control cell placement for an integrated circuit design that includes the steps of receiving as input a description of a datapath structure for a hardmac; calculating a globally optimum placement with respect to connection length and delay for a group of control cells in the plurality of control cells; placing the plurality of control cells in at least one placement box; adding the placement of the plurality of control cells to an existing placement of a plurality of datapath cells in the description of the datapath structure to generate a globally optimum datapath structure for the plurality of control cells; and generating as output the globally optimum datapath structure.

In another embodiment, the invention may be characterized as a computer program product that includes a medium for embodying a computer program for input to a computer and a computer program embodied in the medium for causing the computer to perform the following functions: receiving as input a description of a datapath structure for a hardmac; calculating a globally optimum placement with respect to connection length and delay for a group of control cells in the plurality of control cells; placing the plurality of control cells in at least one placement box; adding the placement of the plurality of control cells to an existing placement of a plurality of datapath cells in the description of the datapath structure to generate a globally optimum datapath structure for the plurality of control cells; and generating as output the globally optimum datapath structure.

BRIEF DESCRIPTION OF THE DRAWINGS

The present invention is illustrated by way of example and not limitation in the accompanying figures, in which like references indicate similar elements, and wherein:

FIG. 1 is a diagram of a typical datapath macro structure of the prior art;

FIG. 2 is a diagram of a general datapath structure for illustrating an embodiment of the present invention;

FIG. 3 is a diagram of a general datapath structure for the datapath block of FIG. 1;

FIG. 4 is a diagram of the datapath block in FIG. 1 illustrating placement boxes for placing control cells;

FIGS. 5A and 5B are a flowchart of a method of placing control cells according to an embodiment of the present invention.

FIG. 6 is a diagram illustrating empty spaces left between datapath cells after datapath cell placement for a datapath block 202 of the datapath structure of FIG. 3;

FIG. 7 is a diagram illustrating placement boxes and gap boxes created from the empty spaces found in FIG. 6;

FIG. 8 is a diagram illustrating the calculation of criticality of a control cell in FIG. 3;

FIG. 9 is a diagram illustrating the calculation of criticality of a control cell net in FIG. 8;

FIG. 10A is a diagram illustrating an initial connection tree model for a control cell net in FIG. 8;

FIG. 10B is a diagram illustrating the modification of the connection tree model of FIG. 10A after refining the graph model;

FIG. 11 is a diagram illustrating an initial optimum location of the control cells with respect to the placement boxes in FIG. 7;

FIG. 12 is a diagram illustrating the optimum locations for the placement of the control cells in FIG. 11;

FIG. 13 is a diagram illustrating an optimum constrained hardmac pin placement for the optimum control cell placement of FIG. 12;

FIGS. 14A, 14B, 14C, 14D, and 14E are a series of diagrams illustrating the estimation of additional space needed for placement of the control cells in FIG. 12;

FIG. 15 is a diagram illustrating the placement of a control cell in a placement box from the optimum location shown in FIG. 12;

FIG. 16 is a diagram illustrating the placement of a control cell 1206 in a placement box 1204 of FIG. 16;

FIGS. 17A and 17B are diagrams illustrating the placement of each control cell in a placement box from the optimum location shown in FIG. 12; and FIG. 18 is a diagram illustrating the preservation of the location of the control cell according to an embodiment of the invention.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE EMBODIMENTS

FIG. 1 is a diagram of a typical datapath macro structure 100. Shown in FIG. 1 are datapath blocks 102, data buses 104, control signals 106, and blocks of control cells 108. In this example, the datapath macro 100 contains only two datapath blocks 102. The data buses 104 are generally routed vertically through the datapath macro 100, while the control signals 106 are generally routed horizontally. The datapath blocks 102 are arranged to include some or all of the data buses 102 and the control signals 104, depending on the functional requirements of each of the datapath blocks 102. The blocks of control cells 108 are placed on each side of the datapath macro 100. Previous methods for placement of the control cells 108 are satisfactory for the simple layout of FIG. 1, but are not practical for datapath macro designs with complex hierarchical structures, complex input constraints on placement of cells, pins, nets, and gaps between cell, datapath blocks, and so on. In the previous methods for placement of the control cells 108, only simple constraints are allowed on the placement of pins, cells, and nets, resulting in poor quality of datapath macro design.

In a complex hierarchical structure, a datapath macro may itself be a datapath block in a datapath macro of a higher level of the hierarchy, and the datapath macro of the higher level of the hierarchy may itself be a datapath block in a datapath macro of a higher level of the hierarchy, and so on.

FIG. 2 is a diagram illustrating a hierarchical structure of a datapath block 102 in FIG. 1. Shown in FIG. 2 are datapath blocks 202. The datapath blocks 202 are generally placed in an arbitrary arrangement that constitutes the structure of the datapath block 102.

FIG. 3 is a diagram of a general datapath structure 300 for the datapath block of FIG. 1. Shown in FIG. 3 are datapath blocks 202 and control cells 302.

Each of the datapath blocks 202 contains vertically routed data buses and horizontally routed control buses. In the general datapath structure 300, the control cells 302 may be placed not only along the left and right sides of the datapath macro 100 as shown in FIG. 1, but may also be distributed inside the datapath blocks 202 in areas that are not occupied by datapath cells or inside clusters that are increased in size to accommodate control cells. Placement columns are specific areas inside predefined gap cells for placing the control cells 302, and additional placement columns may be inserted on the left and right sides of the datapath structure 300. The control cells 302 may also be placed in empty areas called cluster boxes that are left after placement of the datapath cells.

FIG. 4 is a diagram of the datapath block in FIG. 1 illustrating placement boxes for placing control cells. Shown in FIG. 4 are cluster boxes 402, gap boxes 404, and additional placement boxes 406.

The additional placement boxes 406 are created automatically by the place and route tool on the left and right sides of the datapath block 102. Each of the cluster boxes 402, the gap boxes 404, and the additional placement boxes 406 has a relative priority that is proportional to the height of the placement box. The more critical control cells, that is, those having more connections to placed datapath cells, are placed in placement boxes with a higher priority than are the less critical control cells. If the height of any control cell exceeds the hardmac height, then the height of the hardmac may be increased. For each usable empty space, a corresponding placement box is created.

The placement of the control cells is performed after the clusters and datapath cells are placed and an initial placement of hardmac pins is made by, for example, a place and route tool.

FIGS. 5A and 5B are a flowchart of a method of placing control cells according to an embodiment of the present invention.

Step 502 is the entry point of the flowchart 500.

In step 503, a description of a datapath structure for a hardmac is received as input.

In step 504, the height of the hardmac is increased if the height of any control cell exceeds the hardmac height.

In step 506, the models and parameters are generated for the placement of control cells, for example, placement boxes, criticality parameters, and a graph model that describes the hardmac pins, datapath cells, control cells, and nets.

FIG. 6 is a diagram illustrating empty spaces left between datapath cells after datapath cell placement for a datapath block 202 of the datapath structure of FIG. 3. Shown in FIG. 6 are datapath blocks 602, datapath cells 604, and empty spaces 606.

FIG. 7 is a diagram illustrating placement boxes 702 and gap boxes 704 created from the empty spaces found in FIG. 6. The gap boxes 704 are created after placement of the control cells if gap cells are found between clusters. Each gap box 704 is an empty column. Initially, the gap boxes 704 on the left side have negative X-coordinates. After placement of the control cells, a new cluster is created for each of the gap boxes 704, and the new cluster is included in the cluster tree describing the hierarchy of the integrated circuit design, with a possible shift in the X-coordinates of all other clusters.

The criticality of each of the control cells is also calculated in step 506.

FIG. 8 is a diagram illustrating the calculation of criticality of a control cell in FIG. 3. Shown in FIG. 8 are a control cell 802, datapath cells 804, a control cell net 806, a hardmac height H, and a median Y-coordinate M of datapath cells connected to the control cell 802.

The criticality of the control cell 802 may be calculated from the following formula:

$$Criticality(c) = \frac{\sum_i (H - |M - y_i|)}{Hn} \quad (1)$$

where $y_i$ is the Y-coordinate of the $i^{th}$ datapath cell 804 and n is the total number of datapath cells connected to the control cell 802.

The criticality of each control cell net is also calculated in step 506.

FIG. 9 is a diagram illustrating the calculation of criticality of a control cell net in FIG. 8. Shown in FIG. 9 are a control cell 802, datapath cells 804, and a control cell net 806.

If there are no hardmac pins in the net, the criticality of the control cell net 806 may be calculated from the following formula:

$$\text{Criticality}(net_c) = \frac{(n_{dp} + 1)}{(n + 1)} \quad (2)$$

where $n_{dp}$ is the number of datapath cells 804 connected to the control cell net 806, and n is the total number of cells that are connected to the net. If there are hardmac pins in the net, the criticality of the control cell net 806 may be calculated from the following formula:

$$\text{Criticality}(net_c) = \text{coof} \quad (3)$$

where coof is a constant greater than one that gives greater weight to the net if the net includes hardmac pins.

In the graph model, each control cell is represented by a node c and a corresponding weight according to:

$$\text{Weight}(c) = \text{Criticality}(c) \quad (4)$$

Each hardmac pin is represented in the graph as a node p having a corresponding weight given by:

$$\text{Weight}(p) = 1 \quad (5)$$

Each connection from an output of a cell A to an input of a cell B is an edge (A,B) having a corresponding weight given by:

$$\text{Weight}(edge) = \text{Criticality}(net) \quad (6)$$

Parallel edges are replaced with a single edge having a weight equal to the sum of the weights of the parallel edges. The graph describes all nodes that are adjacent to each node.

FIG. 10A is a diagram illustrating an initial connection tree model for a control cell net in FIG. 8. If a control cell drives n datapath cells, only one edge to a datapath cell (typically the leftmost datapath cell) is introduced as shown. Later, the number of edges between the hardmac pins and the datapath cells of the initial connection tree may be modified as shown in FIG. 10B when the graph is refined.

FIG. 10B is a diagram illustrating the modification of the connection tree model of FIG. 10A after refining the graph model. As shown, the number of edges between the hardmac pins and the datapath cells has been increased to two.

In step 508, the globally optimum placement with respect to connection length and delay is calculated for all of the control cells. The globally optimum placement guides the placement of the first 1, 2, 3, . . . , m control cells. The optimum placement of the constrained hardmac pins is calculated based on an initial optimum location of the control cells without regard to their available locations and their sizes.

FIG. 11 is a diagram illustrating an initial optimum location of the control cells with respect to the placement boxes in FIG. 7. Shown in FIG. 11 are placed hardmac pins 1102, placement boxes 1104, placed datapath cells 1106, control cells 1108, and control cell connections 1110.

The placed hardmac pins 1102 are predetermined by user constraints. The placement boxes 1104 define the areas where control cells may be placed. The placed datapath cells 1106 have locations already selected by a place and route tool. An optimum placement is sought for the control cells 1108 that minimizes interconnection length and delay for the control cell connections 1110. The number of control cells in a datapath design is typically about 10 percent to 20 percent of the total number of cells. A control cell placement is a globally optimum placement if a placement quality function (in this case, the total length of the control cell connections) has a global minimum at the control cell coordinates without regard to available locations for placement of the control cell and the size of the control cell. In the method of the present invention, the placement quality function describes a weighted sum of cell connection lengths as explained in greater detail below. The placement quality function, or criterion, is therefore optimum with respect to connectivity length. The optimum placement defined by the placement quality function guides the placement of datapath cells and hardmac pins, and may be further refined from time to time. By minimizing the function F, the minimum connection delays, which are proportional to the square of the connection lengths, and the minimum connection length are realized. Each control cell corresponds to a node of the graph. If there are n nodes in the graph, each edge may be represented by the coordinates $X_i$ and $Y_j$ for each pair of nodes i and j corresponding to the control cells at the ends of the control cell connection as follows:

$$F = \sum_{i=1}^{n} \sum_{j=1}^{n} W_{ij} [(X_i - X_j)^2 + (Y_i - Y_j)^2] \quad (7)$$

By differentiating F with respect to $X_i$ and $Y_i$ (i=1,2,3, . . . n) and equating the derivative of F to zero, the following expressions may be obtained to iteratively calculate the ideal coordinates of the control cell ($X_i$, $Y_i$):

$$X_i = \frac{\sum_{j \in A_i} W_{ij} X_j}{\sum_{j \in A_i} W_{ij}} \quad (8)$$

$$Y_i = \frac{\sum_{j \in A_i} W_{ij} Y_j}{\sum_{j \in A_i} W_{ij}} \quad (9)$$

where $A_i$ is the set of nodes adjacent to node i, $W_{ij}$ is the weight of edge (i,j), and ($X_i$, $Y_i$) and ($X_j$, $Y_j$) are the coordinates of the nodes at the ends of the edge (i,j). The iterations are performed by receiving an initial set of coordinates for the control and datapath cell locations and repetitively solving equations (8) and (9) for new values of $X_i$ and $Y_i$ (i=1, 2, 3, . . . n), inserting the new values of $X_i$ and $Y_i$ into the right side of equations (3) and (4) for each iteration. The iterations may be terminated, for example, when a selected minimum change in all the control cell locations calculated from the previous iteration is observed.

FIG. 12 is a diagram illustrating the optimum locations for the placement of the control cells in FIG. 11. Shown in FIG. 12 are a hardmac 1202, placement boxes 1204 and placed control cells 1206.

In step 510, the graph model is refined after the placement of each group of m control cells to take into account changes to the net tree configurations that are built from the optimum location of hardmac pins and control cells. A typical value for m is from 5 to 10 percent of the total number of control cells. After making several changes to the locations of hardmac pins and control cells, the procedure is repeated several times during the placement of the control cells in a similar manner as the pin assignment function. The initial and refined tree models for a net are illustrated in FIGS. 10A and 10B, respectively.

In step 512, an optimum constrained hardmac pin placement is calculated based on the optimum location of the hardmac pins and the location of datapath and control cells.

FIG. 13 is a diagram illustrating an optimum constrained hardmac pin placement for the optimum control cell placement of FIG. 12. Shown in FIG. 13 are a hardmac 1302, placement boxes 1304, gap boxes 1306, and placed hardmac pins 1308.

In step 514, the globally optimum locations of the control cells and the graph model are refined to take into account a possible change in the location of the hardmac pins 1308 in step 512.

In step 516, if there are unplaced control cells remaining, processing continues at step 518. Because the placement of the control cells is performed for each group of m control cells, several iterations of the next three steps may be needed to place all of the control cells. When all of the control cells have been placed, processing continues at step 522.

In step 518, the amount of additional space needed to place all of the control cells in the datapath is estimated. The estimate of additional space begins with an assumption of utilization of control cells in placement boxes. For example, a utilization of 0.9 may be assumed, that is, 90 percent of the columns are assumed to be occupied by control cells. The assumed utilization is decreased, typically by a value of about 5 percent, and the placement is repeated as many times as needed, usually two or three times, to place all of the control cells in the datapath. The additional space is provided by forming additional placement boxes in columns on the sides of the hardmac 1302. The estimate of the additional space needed in the gap boxes 1306 is made by dividing the hardmac 1306 into two partitions.

FIGS. 14A, 14B, 14C, 14D, and 14E are a series of diagrams illustrating the estimation of additional space needed for placement of the control cells in FIG. 12.

FIG. 14A illustrates the division of the hardmac into left and right partitions having equal area to find control cells that are more likely to be placed in the left or the right portion of the datapath. Shown in FIG. 14A are a hardmac 1202, placement boxes 1204, placed control cells 1206, and partitions 1402 and 1404.

Using the optimum location of the control cells 1206 and the existing placement boxes 1204, the available space in each of the two parts and the amount of space needed for placement of the control cells in each of partitions 1402 and 1404 is calculated. The difference between the results of these calculations is the deficit, that is, the amount of space needed for each of the partitions 1402 and 1404.

If the deficit in each of the partitions 1402 and 1404 is less than a predefined threshold T, typically about 5 percent, then no additional placement boxes are introduced on either side of the hardmac 1202, as illustrated in FIG. 14B.

If the deficit in the left partition 1402 exceeds the predefined threshold T, then additional placement boxes 1406 are introduced at the left side of the hardmac 1202 as illustrated in FIG. 14C.

If the deficit in the right partition 1404 exceeds the predefined threshold T, then additional placement boxes 1406 are introduced at the right side of the hardmac 1202 as illustrated in FIG. 14D.

If the deficit in the left partition 1402 and the right partition 1404 exceeds the predefined threshold T, then additional placement boxes 1406 are introduced on both the left and the right sides of the hardmac 1202 as illustrated in FIG. 14E.

The number of additional placement boxes 1406 is calculated as a ratio of the deficit to an area of an additional placement box 1406. The maximum priority is also assigned to each additional placement box 1406. For each additional placement box 1406 introduced, a new cluster is formed and included in the cluster tree describing the hierarchy of the integrated circuit design with a possible shift in the X-coordinates of other clusters and cells.

In step 520, the control cells are placed in the placement boxes. In this step, the control cells are assigned to placement boxes and located inside the placement boxes. The assignment of hardmac pins, the optimum placement of the control cells, and the graph model may be periodically refined after placing each set of m control cells. The control cells are preferably assigned in the order of their criticality, so that the more important control cells are placed first.

FIG. 15 is a diagram illustrating the placement of a control cell in a placement box from the optimum location shown in FIG. 12. Shown in FIG. 15 are a hardmac 1202, placement boxes 1204, and control cells 1206.

When the control cell 1206 is assigned to a placement box 1204, the optimum location is selected for placing the control cell 1206 in the placement box 1204. At first, a small overlap of the control cell 1206 with other cells already assigned to the placement box 1204 are allowed as shown in FIG. 16.

FIG. 16 is a diagram illustrating the placement of a control cell 1206 in a placement box 1204 of FIG. 15. Shown in FIG. 16 are a placement box 1204, control cells 1206, and datapath cells 1602.

If an assignment of a control cell 1206 to the placement box 1204 exceeds the capacity of the placement box 1204, then the control cell 1206 is not placed in the placement box 1204, thus ensuring that a final placement exists for each control cell with respect to all constraints. The control cell 1206 is assigned to the nearest placement box 1204 if there is sufficient available space. The small overlap between control cells allowed in the initial placement does not exceed the capacity of the placement box 1204.

FIGS. 17A and 17B are diagrams illustrating the placement of each control cell in a placement box from the optimum location shown in FIG. 12. Shown in FIGS. 17A and 17 B are a hardmac 1202, placement boxes 1204, and control cells 1206.

In FIG. 17A, there is sufficient available space in each of the placement boxes 1204 to accommodate the assigned control cells 1206.

In FIG. 17B, there is insufficient available space in each of the placement boxes 1204 to accommodate the assigned control cells 1206, forcing reassignment to more distant placement boxes 1204.

Control cells that are drivers or receivers typically have stronger constraints on their placement. For example, it is possible to restrict their placement only to gap boxes and additional placement boxes. If not all control cells are placed, there is a deficit of available space. If there is a deficit of available space, processing repeats from step 518. Otherwise, processing continues from step 516.

In step 522, the final placement of the control cells in placement boxes is performed. In this step, the slightly overlapping control cells are spread apart to eliminate cell overlap. The location of all critical cells, especially drivers and receivers, is preserved insofar as possible.

FIG. 18 is a diagram illustrating the preservation of the location of a critical control cell according to an embodiment of the invention. Shown in FIG. 18 are a critical control cell 1802, datapath cells 1804, and a placement box 1806. The critical control cell 1802 is assigned a fixed location that best satisfies all location constraints.

In step 524, the placement of the control cells in placement boxes is further optimized by moving control cells (except drivers and receivers) within columns and between columns.

In step 526, a new cluster is created for each additional placement box and included in the cluster tree.

In step 528, the placement of control cells is added to the existing placement of datapath cells to generate as output a global datapath structure including datapath cells, control cells, and hardmac pins.

In step 530, additional optional steps may be performed to process the global datapath structure generated in step 528, such as the calculation of various quality criteria to estimate the quality of the control cell placement, for example, main criteria including hardmac utilization, connection linearity, net linearity, bend ratio, congestion, maximum connection length, total net length, average net length, average connection length, and additional criteria including linearity count, net linearity count, sum of net half-perimeters, sum of net areas, average net half-perimeter, average net area, average connection half-perimeter, average connection area, maximum net half-perimeter, maximum net area, maximum connection half-perimeter, maximum connection area, number of bends in connections, and the maximum connection density; the calculation of a congestion map; the calculation of the hardmac porosity in the vertical and horizontal directions; and other processing steps as may become apparent to a skilled practitioner of the art.

Step 532 is the exit point of the flow chart 500.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

The method illustrated in the flowchart description above may be embodied in a computer program product and implemented by a computer according to well known programming techniques to perform the following functions: receiving as input a datapath description including an initial set of coordinates for a plurality of control cells; ordering the plurality of control cells in a sequence (1, 2, 3, . . . , n) according to distance between each of the plurality of control cells and at least one fixed control cell in the plurality of control cells wherein n is the number of control cells in the datapath description; iteratively calculating globally optimum coordinates for the each of the plurality of control cells according to the sequence i=1, 2, 3, . . . , n from a global maximum of a control cell placement function; and generating as output the calculated globally optimum coordinates for the each of the plurality of control cells.

The method of the present invention for control cell placement described above advantageously accommodates datapath designs having a large number of datapath and control cells, produces a globally ideal control cell placement in terms of connectivity length and interconnection delays, includes internal cell pins, and has an almost linear time cost function.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of control cell placement comprising steps of:
   (a) receiving as input a description of a datapath structure for a hardmac;
   (b) calculating a globally optimum placement with respect to connection length and delay for a group of control cells in a plurality of control cells within the datapath structure;
   (c) placing the plurality of control cells in at least one placement box;
   (d) adding the placement of the plurality of control cells to an existing placement of a plurality of datapath cells in the datapath structure to generate a globally optimum datapath structure for the plurality of control cells; and
   (e) generating as output the globally optimum datapath structure.

2. The method of claim 1 wherein step (b) comprises increasing a height of the hardmac if the height of at least one of the plurality of control cells exceeds the height of the hardmac.

3. The method of claim 1 wherein step (b) comprises generating models and parameters for the placement of the plurality of control cells.

4. The method of claim 3 wherein step (b) comprises generating a graph model that describes a plurality of pins, a plurality of datapath cells, the plurality of control cells, and a plurality of nets for the hardmac.

5. The method of claim 1 wherein step (b) comprises refining the placement of the plurality of control cells and a graph model of the datapath structure to accommodate changes to net tree configurations resulting from changes to locations of hardmac pins and the placement of the plurality of control cells.

6. The method of claim 5 wherein step (c) comprises estimating an area of an additional placement box to place at least one of the plurality of control cells.

7. The method of claim 6 wherein step (c) comprises creating a new cluster for the additional placement box and including the new cluster in a corresponding cluster tree.

8. The method of claim 6 wherein step (c) comprises refining the placement of the plurality of control cells by moving at least one of the plurality of control cells within columns and between columns of the at least one placement box.

9. The method of claim 1 wherein step (b) comprises calculating an optimum placement of a plurality of constrained hardmac pins from an initial optimum placement of the plurality of control cells that is not subject to a restriction on available locations or on available area within the hardmac.

10. A computer program product comprising:
    a medium for embodying a computer program for input to a computer; and
    a computer program embodied in the medium for causing the computer to perform steps of:
    (a) receiving as input a description of a datapath structure for a hardmac;
    (b) calculating a globally optimum placement with respect to connection length and delay for a group of control cells in a plurality of control cells within the datapath structure;
    (c) placing the plurality of control cells in at least one placement box;
    (d) adding the placement of the plurality of control cells to an existing placement of a plurality of datapath cells in the datapath structure to generate a globally optimum datapath structure for the plurality of control cells; and
    (e) generating as output the globally optimum datapath structure wherein step (b) comprises increasing a height of the hardmac if the height of at least one of the plurality of control cells exceeds the height of the hardmac.

11. A computer program product comprising:
    a medium for embodying a computer program for input to a computer; and a computer Program embodied in the medium for causing the computer to Perform steps of:
   (a) receiving as input a description of a datapath structure for a hardmac;
   (b) calculating a globally optimum placement with respect to connection length and delay for a group of control cells in a plurality of control cells within the datapath structure,
   (c) placing the plurality of control cells in at least one placement box;
   (d) adding the placement of the plurality of control cells to an existing placement of a plurality of datapath cells in the datapath structure to generate a globally optimum datapath structure for the plurality of control cells; and
   (e) generating as output the globally optimum datapath structure wherein step (b) comprises generating models and parameters for the placement of a plurality of control cells in the hardmac.

12. The computer program product of claim 1 wherein step (b) comprises generating a graph model that describes a plurality of pins, a plurality of datapath cells, the plurality of control cells, and a plurality of nets for the hardmac.

13. The computer program product of claim 12 wherein step (b) comprises refining the placement of the plurality of control cells and the graph model to accommodate changes to net tree configurations resulting from the placement of the plurality of control cells.

14. A computer program product comprising:
a medium for embodying a computer program for input to a computer; and
a computer program embodied in the medium for causing the computer to Perform steps of:
   (a) receiving as input a description of a datapath structure for a hardmac;
   (b) calculating a globally optimum placement with respect to connection length and delay for a group of control cells in a plurality of control cells within the datapath structure;
   (c) placing the plurality of control cells in at least one placement box;
   (d) adding the placement of the plurality of control cells to an existing placement of a plurality of datapath cells in the datapath structure to generate a globally optimum datapath structure for the plurality of control cells; and
   (e) generating as output the globally optimum datapath structure wherein step (c) comprises estimating an area of an additional placement box to place at least one of the plurality of control cells.

15. The computer program product of claim 14 wherein step (c) comprises creating a new cluster for the additional placement box and including the new cluster in a corresponding cluster tree.

16. A computer program product comprising:
a medium for embodying a computer program for input to a computer; and
a computer program embodied in the medium for causing the computer to Perform steps of:
   (a) receiving as input a description of a datapath structure for a hardmac;
   (b) calculating a globally optimum placement with respect to connection length and delay for a group of control cells in a plurality of control cells within the datapath structure;
   (c) Placing the plurality of control cells in at least one placement box;
   (d) adding the placement of the plurality of control cells to an existing placement of a plurality of datapath cells in the datapath structure to generate a globally optimum datapath structure for the plurality of control cells; and
   (e) generating as output the globally optimum datapath structure wherein step (c) comprises refining the placement of the plurality of control cells by moving at least one of the plurality of control cells within columns and between columns of the at least one placement box.

17. A computer program product comprising:
a medium for embodying a computer Program for input to a computer; and
a computer program embodied in the medium for causing the computer to perform steps of:
   (a) receiving as input a description of a datapath structure for a hardmac;
   (b) calculating a globally optimum placement with respect to connection length and delay for a group of control cells in a plurality of control cells within the datapath structure;
   (c) placing the plurality of control cells in at least one placement box;
   (d) adding the placement of the plurality of control cells to an existing placement of a plurality of datapath cells in the datapath structure to generate a globally optimum datapath structure for the plurality of control cells; and
   (e) generating as output the globally optimum datapath structure wherein step (b) comprises calculating an optimum placement of a plurality of constrained hardmac pins from an initial optimum placement of the plurality of control cells that is not subject to a restriction on available locations or on available area within the hardmac.

18. The method of claim 3 wherein step (b) comprises generating a graph model that describes a plurality of pins, a plurality of datapath cells, the plurality of control cells, and a plurality of nets for the hardmac wherein each of the plurality of control cells is represented by a node and a corresponding node weight, each of the plurality of pins is represented as a node having a corresponding pin weight, each connection from an output of a first cell to an input of a second cell is an edge having a corresponding edge weight, and parallel edges are replaced with a single edge having a weight equal to a sum of the edge weights of the parallel edges.

19. The computer program product of claim 11 wherein step (b) comprises generating a graph model that describes a plurality of pins, a plurality of datapath cells, the plurality of control cells, and a plurality of nets for the hardmac wherein each of the plurality of control cells is represented by a node and a corresponding node weight, each of the plurality of pins is represented as a node having a corresponding pin weight, each connection from an output of a first cell to an input of a second cell is an edge having a corresponding edge weight, and parallel edges are replaced with a single edge having a weight equal to a sum of the edge weights of the parallel edges.

* * * * *